United States Patent
Paton et al.

(10) Patent No.: US 6,811,448 B1
(45) Date of Patent: Nov. 2, 2004

(54) PRE-CLEANING FOR SILICIDATION IN AN SMOS PROCESS

(75) Inventors: Eric N. Paton, Morgan Hill, CA (US); Paul R. Besser, Sunnyvale, CA (US); Qi Xiang, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/619,879

(22) Filed: Jul. 15, 2003

(51) Int. Cl.[7] .............................................. H01L 21/302
(52) U.S. Cl. ..................... 439/706; 438/752; 438/694
(58) Field of Search ................................ 438/751, 752, 438/706

(56) References Cited

U.S. PATENT DOCUMENTS 5,403,434 A * 4/1995 Moslehi ...................... 134/1.2
6,187,682 B1 * 2/2001 Denning et al. ............ 438/694

* cited by examiner

*Primary Examiner*—David Nelms
*Assistant Examiner*—Thao P. Le
(74) *Attorney, Agent, or Firm*—Foley & Lardner

(57) ABSTRACT

A fabrication system utilizes a protocol for removing native oxide from a top surface of a wafer. An exposure to a plasma, such as a plasma containing hydrogen and argon can remove the native oxide from the top surface without causing excessive germanium contamination. The protocol can use a hydrogen fluoride dip. The hydrogen fluoride dip can be used before the plasma is used. The protocol allows better silicidation in SMOS devices.

20 Claims, 7 Drawing Sheets

PRE-CLEANING FOR SILICIDATION IN AN SMOS PROCESS

FIELD OF THE INVENTION

The present invention relates generally to integrated circuit (IC) fabrication. More particularly, the present invention relates to a system for and a method of cleaning a top surface of an IC substrate.

BACKGROUND OF THE INVENTION

SMOS processes are utilized to increase transistor (MOSFET) performance by increasing the carrier mobility of silicon, thereby reducing resistance and power consumption and increasing drive current, frequency response and operating speed. Strained silicon is typically formed by growing a layer of silicon on a silicon germanium substrate or layer. Germanium can also be implanted, deposited, or otherwise provided to silicon layers to change the lattice structure of the silicon and increase carrier mobility.

The silicon germanium lattice associated with the germanium substrate is generally more widely spaced than a pure silicon lattice, with spacing becoming wider with a higher percentage of germanium. Because the silicon lattice aligns with the larger silicon germanium lattice, a tensile strain is created in the silicon layer. The silicon atoms are essentially pulled apart from one another. Relaxed silicon has a conductive band that contains six equal valance bands. The application of tensile strength to the silicon causes four of the valance bands to increase in energy and two of the valance bands to decrease in energy. As a result of quantum effects, electrons effectively weigh 30 percent less when passing through the lower energy bands. Thus, lower energy bands offer less resistance to electron flow.

In addition, electrons meet with less vibrational energy from, the nucleus of the silicon atom, which causes them to scatter at a rate of 500 to 1,000 times less than in relaxed silicon. As a result, carrier mobility is dramatically increased in strained silicon compared to relaxed silicon, providing an increase in mobility of 80 percent or more for electrons and 20 percent or more for holes. The increase in mobility has been found to persist for current fields up to 1.5 megavolt/centimeter. These factors are believed to enable device speed increase of 35 percent without further reduction of device size, or a 25 percent reduction in power consumption without reduction in performance.

Conventional processes pre-clean the top surface of the wafer to remove oxide before metal deposition. For example, when gate conductors and source and drain regions are silicided, a cleaning process (e.g., a plasma PCII clean process) can provide a biased plasma of argon to physically sputter and pre-clean the wafer surface. The pre-cleaning can be performed to reduce the amount of native oxides (e.g., thin silicon dioxide ($SiO_2$) layers) on the top surface of the wafer and the gate conductor. Native oxides prevent an appropriate silicidation reaction in subsequent steps.

After pre-cleaning, a metal layer can be deposited over the top surface of the wafer and the gate conductor. The metal layer can be reacted with the semiconductor surface of the wafer and the gate conductor to form metal silicide ($Me_xSi_y$) regions. Metal silicide regions can include layers of titanium silicide, nickel silicide, cobalt silicide, etc.

Heretofore, conventional pre-cleaning processes have used a purely physical plasma pre-cleaning process such as the plasma PCII clean process. Purely physical plasma pre-cleaning processes have caused germanium resputtering from the wafer surface. Germanium resputtering can also occur from the gate conductor if a silicon germanium or strained silicon gate conductor is used. Germanium resputtering can contaminate the walls of the chamber of the fabrication equipment. In addition, argon pre-cleaning processes can unnecessarily consume silicon and cause silicon damage.

Germanium contamination of IC equipment is becoming a more serious issue as IC fabrication processes explore the advantages of the higher carrier mobility of strained silicon (SMOS) devices. IC fabrication equipment that tends to become contaminated with germanium can include deposition chambers, furnaces, diffusion equipment, etching tools, etc. The quartzware associated with such equipment is particularly susceptible to germanium contamination.

Germanium contamination is particularly problematic when equipment is used in both non-germanium and germanium fabrication lines. Shared equipment must be purged of germanium contamination before it is used in non-germanium processes, because such contamination is particularly damaging to metals used during conventional IC fabrication. Further, high levels of germanium contamination can be problematic even for strained silicon (SMOS) processes.

Flash devices are particularly sensitive to low level germanium contamination, because Flash technology uses IC structures and processes that are incompatible with germanium. For example, germanium contamination may cause data retention problems for the Flash memory cell. It is nevertheless desirous to use equipment associated with the Flash fabrication line with germanium containing products (e.g., SMOS products).

Thus, there is a need for an efficient process for pre-cleaning a wafer surface and a gate conductor. Further, there is a need for a system and a method which reduces germanium contamination caused by conventional pre-cleaning. Even further, there is a need for a method of reducing germanium contamination from a strained silicon layer. Yet further, there is a need for a process which reduces the adverse effects of germanium on silicidation processes. Further, there is a need for a pre-cleaning process that allows shared equipment to be used in both a Flash production line and a germanium production line.

SUMMARY OF THE INVENTION

An exemplary embodiment relates to a method of manufacturing an integrated circuit. The method includes providing a substrate, providing a gate structure above the substrate and pre-cleaning the substrate with an argon and hydrogen plasma. The substrate includes a layer including germanium. The method also includes siliciding the substrate.

Another exemplary embodiment relates to a method of pre-cleaning a top surface of an IC substrate before silicidation in a chamber. The method includes providing a plasma including hydrogen in the chamber and removing native oxide from the IC substrate. In one embodiment, a wet bath can be utilized to reduce the thickness of the native oxide layer before the providing step.

Yet another exemplary embodiment relates to a method of manufacturing a transistor on an integrated circuit. The method includes providing a gate structure on a top surface of a strained silicon layer or a silicon germanium layer, providing a plasma including hydrogen and argon to remove a native oxide material, and siliciding the top surface.

BRIEF DESCRIPTION OF THE DRAWINGS

Exemplary embodiments will hereafter be described with reference to the accompanying drawings, wherein like numerals denote like elements, and.

DETAILED DESCRIPTION OF PREFERRED AND EXEMPLARY EMBODIMENTS

FIGS. 1 through 10 illustrate a method of manufacturing an integrated circuit (IC) in accordance with an exemplary embodiment. The method illustrated in FIGS. 1 through 10 reduces germanium resputtering problems associated with removing native oxide on IC structures. The process includes at least one plasma cleaning step and can be used as a part of any process utilizing germanium or other substance prone to resputtering. Advantageously, native oxide is removed from a top surface of the IC substrate, layers above the IC substrate, or a gate conductor without significant germanium resputtering.

Figure 1:
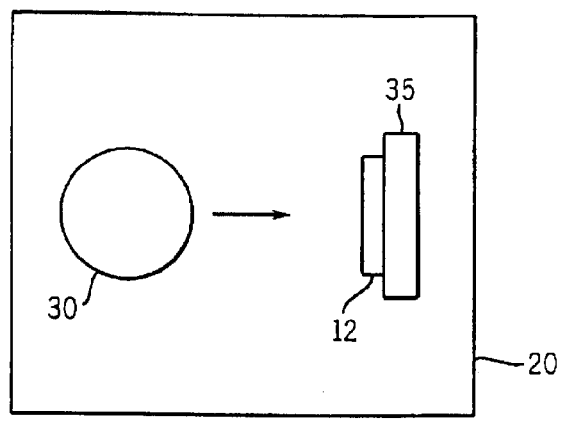
FIG. 1 is a general schematic block diagram of a fabrication system including a chamber and an IC substrate.

With reference to FIG. 1, fabrication system or equipment 20 is preferably a fabrication tool or fabrication equipment associated with a germanium fabrication process such as an SMOS process or a germanide process (e.g., where SiGe contacts are formed). In one embodiment, system 20 can be deposition equipment including a deposition source 30. Deposition source 30 can be used to provide a metal layer for a silicidation process.

In other embodiments, fabrication system 20 can be an etching chamber, a diffusion chamber, an annealing furnace, or another device for processing a substrate associated with a portion 12 of an integrated circuit. Quartzware associated with system 20 is particularly susceptible to germanium contamination.

System 20 can include a chamber within which portion 12 is provided. The chamber can generally include a stage or pedestal 35 for holding portion 12. The chamber can be a vacuum chamber for metal deposition.

In one embodiment, system 20 can be utilized in a fabrication line associated with both a germanium process and a non-germanium process. During operation in the germanium process, system 20 can become contaminated with germanium and should be decontaminated before use in the non-germanium process.

Figure 2:
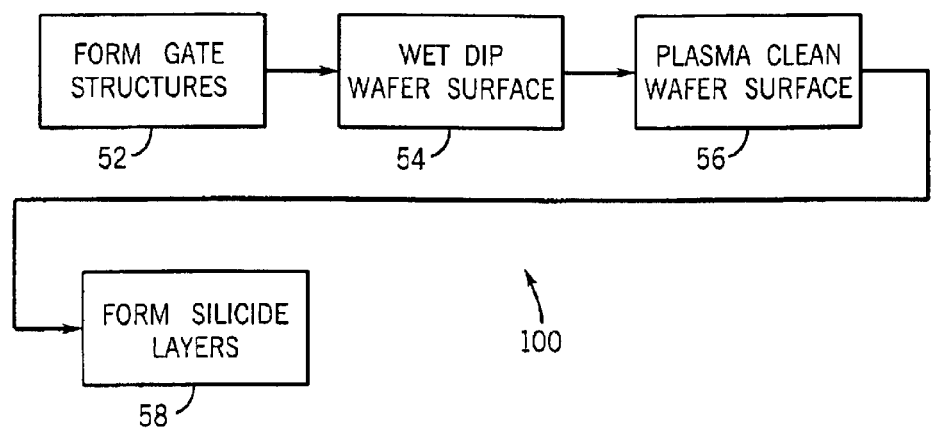
FIG. 2 is a flow diagram showing a pre-cleaning process for the IC substrate in the fabrication system illustrated in FIG. 1 in accordance with an exemplary embodiment.
Figure 3:
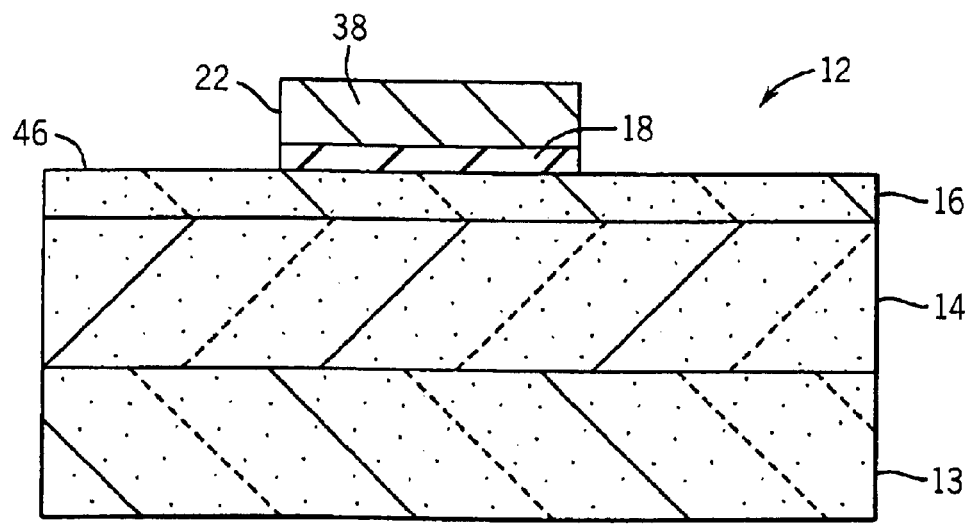
FIG. 3 is a cross-sectional view schematic drawing of a portion of an IC substrate illustrated in FIG. 1, the IC substrate including a strained silicon layer above a silicon germanium substrate and a metal gate conductor.

With reference to FIG. 2, a process 100 can be utilized when forming silicide layers and advantageously pre-cleans portion 12 (e.g., the substrate associated with portion 12) of native oxide. Preferably, process 100 pre-cleans native oxide and CVD deposited oxide from a top surface 46 (FIG. 3) of the substrate associated with portion 12 after gate structures are formed in a step 52.

In a step 54, portion 12 is subject to a wet etch or wet dip as part of a pre-cleaning step. Preferably, a hydrofluoric acid (HF) mixture is used to eliminate the native oxide (e.g., an 8–15 Å native oxide) and CVD deposited oxide (e.g., a 150–500 Å oxide) on portion 12. The HF dip can use concentrated HF diluted in deionized ultrapure water with a water:HF ratio of between approximately 50:1 and 1000:1 (e.g., between appoximately 100:1 and 500:1.) The HF dip is performed at approximately room temperature for a period of between approximately 2 and 10 minutes. A nitrogen ambient is used during the transfer of portion 12 to a drying module. According to an exemplary embodiment, the HF dip can use a bath of water and HF. According to an alternative embodiment, a water and HF rinse (e.g., using a spray tool) may be utilized. The HF dip leaves a hydrogen terminated surface that may inhibit native oxide regrowth during subsequent processing steps.

In a step 56, the surface of the substrate associated with portion 12 is subject to a plasma pre-cleaning cleaning step. The plasma cleaning step preferably utilizes a combined plasma of Argon (Ar) and Hydrogen (H) (e.g., a PCII clean). Step 56 substantially eliminates remaining native oxide.

In a step 58, silicide layers can be formed. The silicide layers are preferably formed above source and drain regions on either side of the gate structures formed in step 52. Removal of the native oxide at steps 54 and 56 allows suitable silicide layers to be formed. The silicide layer can also be above the gate conductor.

Steps 54 and 56 of process 100 result in less germanium resputtering from the top surface of the substrate for portion 12. The chemical nature of steps 54 and 56 make pre-cleaning a less physical process and hence, less susceptible to germanium resputtering and substrate damage. In one embodiment, process 100 utilizes steps 54 and 56 after gate formation (step 52).

Referring to FIGS. 3 through 10, a cross-sectional view of a portion 12 of an integrated circuit (IC) is illustrated. Portion 12 is subjected to process 100 (FIG. 2) to form an IC. The IC can include a transistor with a gate structure and silicided source and drain region fabricated as explained below. Portion 12 includes a strained silicon layer 16 provided over a semiconductor substrate 14 or a germanium containing layer or substrate. Substrate 14 can be provided above a substrate 13.

Substrate 13 is optional and portion 12 can be provided with substrate 14 as the bottom-most layer. Substrate 13 can be the same material or a different material than substrate 14. In one embodiment, substrate 13 is a semiconductor substrate such as a silicon substrate upon which substrate 14 has been grown.

Portion 12 can be any type of semiconductor device, or portion thereof, made from any of the various semiconductor processes such as a complementary metal oxide semiconductor (CMOS) process, a bipolar process, or any other semiconductor process. Portion 12 may be an entire IC or a portion of an IC and may include a multitude of electronic components.

Substrate 14 is preferably a silicon germanium or other semiconductor material including germanium, and can be doped with P-type dopants or N-type dopants. Substrate 14 can be an epitaxial layer provided on a semiconductor or an insulative base, such as substrate 13. Furthermore, substrate 14 is preferably a composition of silicon germanium ($Si_{1-x}Ge_x$, where X is approximately 0.2 and is more generally in the range of 0.1 and 0.3 for SMOS applications and in the range of 0.03 and 0.8 for non-SMOS applications (e.g., where SiGe contacts are used)). Substrate 14 can be grown or deposited.

In one embodiment, substrate 14 is grown above substrate 13 by chemical vapor deposition (CVD) using disilane ($Si_2H_6$) and germane ($GeH_4$) as source gases with a substrate temperature of between approximately 600° and 800° C. (e.g., approximately 650° C.), a disilane partial pressure of approximately 30 mPa and a germane partial pressure of approximately 60 mPa. While according to the preferred embodiment disilane gas is used, according to alternative embodiments, dichlorosilane or hexachlorosilane may be used. Growth of silicon germanium material may be initiated using these ratios, or, alternatively, the partial pressure of germanium may be gradually increased beginning from a lower pressure or zero pressure to form a gradient composition. Alternatively, a silicon layer can be doped by ion implantation with germanium or by another process to form substrate 14. Preferably, substrate 14 is grown by epitaxy to a thickness of less than approximately 5000 Å (and preferably between approximately 1500 Å and 4000 Å).

A strained silicon layer 16 is formed above substrate 14 by an epitaxial process. Preferably, layer 16 is grown by, CVD using a disilane ($Si_2H_6$) as a source gas at a temperature of between approximately 600 and 800° C. (e.g., approximately 650° C.). Layer 16 can be a pure silicon layer and have a thickness of between approximately 50 and 500 Å, and preferably approximately 200 Å.

Process 100 is described below with respect to portion 12 in FIGS. 3–10. At step 52, a gate structure 22 is formed on portion 12. Gate structure 22 preferably includes a metal or polysilicon gate conductor 38 and a gate dielectric 18. Gate dielectric 18 can be a high-k gate dielectric or a silicon dioxide gate dielectric.

In one embodiment, gate dielectric 18 is a 5–30 Angstrom thick layer of thermally grown silicon dioxide. Gate conductor 38 can be a 1000–2000 Angstrom thick layer of refractory metal or polysilicon which is selectively etched to form gate structure 22. Process 100 is discussed below with reference to FIGS. 3–10 with gate conductor 38 being a metal material which is not silicided.

Figure 4:
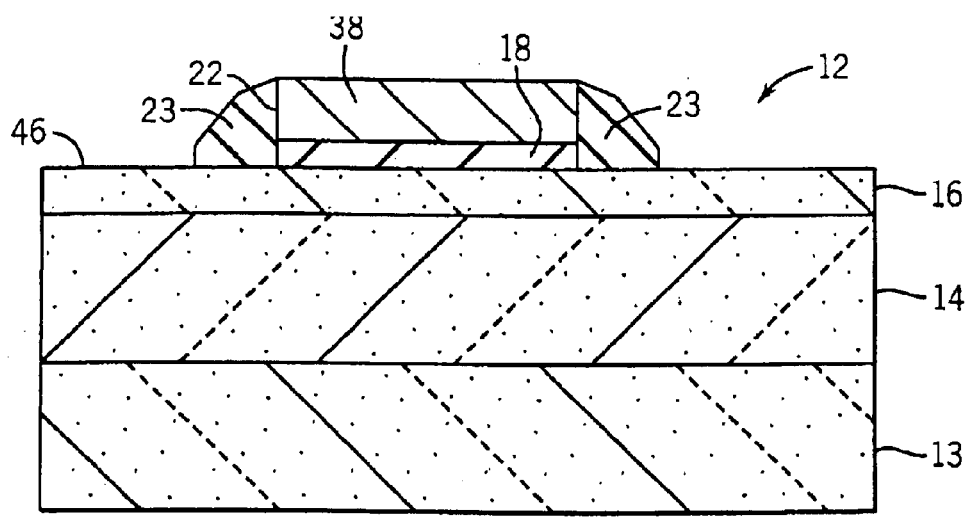
FIG. 4 is a cross-sectional view of the portion illustrated in FIG. 3, showing a spacer formation step.

In FIG. 4, spacers 23 are provided to gate conductor 38 via a conventional deposition and etch back process. Preferably, spacers 23 are silicon dioxide or silicon nitride. The formation of spacers 23 can complete gate structure 22 at step 52.

Figure 5:
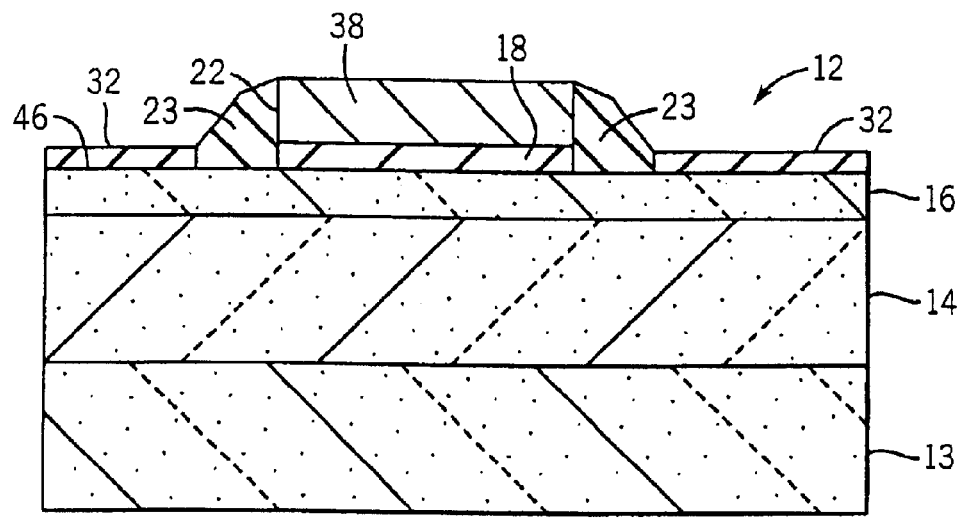
FIG. 5 is a cross-sectional view of the portion illustrated in FIG. 4, showing a native oxide layer above the IC substrate.

In FIG. 5, a native oxide material or layer 32 is formed during the formation of gate structure 22 on a top surface 46 of layer 16 or when other structures are formed on portion 12. Layer 32 can be caused by a variety of processes and can naturally be present on the wafer when purchased. In one embodiment, layer 32 is an oxide layer (e.g., silicon dioxide ($SiO_2$)) having a thickness between approximately 10 and 20 Å (e.g., approximately 15 Å).

Figure 6:
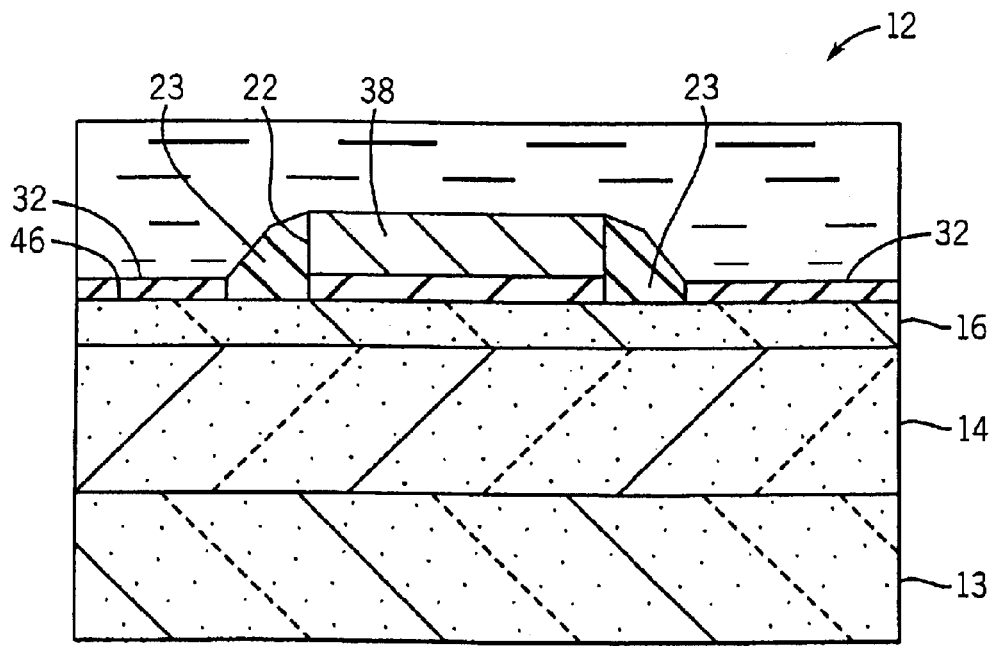
FIG. 6 is a cross-sectional view of the portion illustrated in FIG. 5, showing a dipping step.

In FIG. 6, at step 54, portion 12 is subjected to a wet dip to reduce the thickness of layer 32. The wet dip is represented by dashed cross-sectional lines above layer 32 and gate structure 22 in FIG. 5.

A two-step cleaning process is used for portion 12. First, an HF dip is used to target thermal oxide (e.g., native oxide layer 32). Second, a hydrogen and argon plasma PCII clean is performed to remove the remaining native oxide which forms after the initial HF dip. The plasma is represented by arrows 37 in FIG. 7. A total gas pressure of approximately 100 Pa and a hydrogen flow rate of approximately 100 sccm is utilized for the plasma oxide reduction. The plasma clean utilizes a capacitively coupled RF power supply which provides approximately 500 watts of total power.

Figure 8:
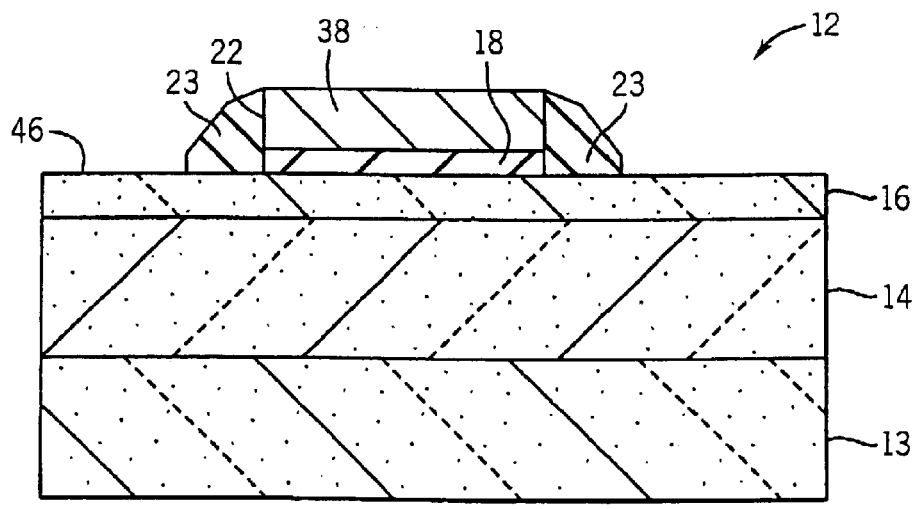
FIG. 8 is a cross-sectional view of the portion illustrated in FIG. 7, showing removal of the native oxide.
Figure 9:
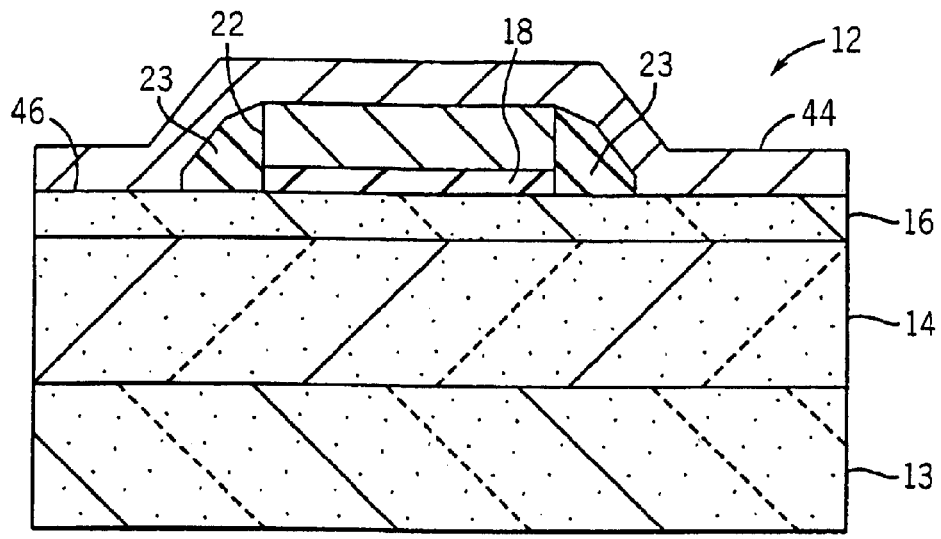
FIG. 9 is a cross-sectional schematic view of the IC substrate illustrated in FIG. 8, showing a metal layer depletion step.

In FIG. 8, top surface 46 is shown with layer 32 removed. After layer 32 is removed, a metal layer 44 is deposited over top layer 36 in gate structure 22 (FIG. 9). Preferably, a metal layer associated with silicidation is deposited by chemical vapor deposition (CVD) or sputtering. In one embodiment, layer 44 is an approximately 80 to 150 Å (e.g., approximately 100 Å) thick layer of nickel, cobalt, tungsten, or titanium deposited in a physical vapor deposition (PVD) vacuum deposition chamber. Alternative materials for layer 44 include any metal suitable for use in silicidation (e.g., refractory metals).

Figure 7:
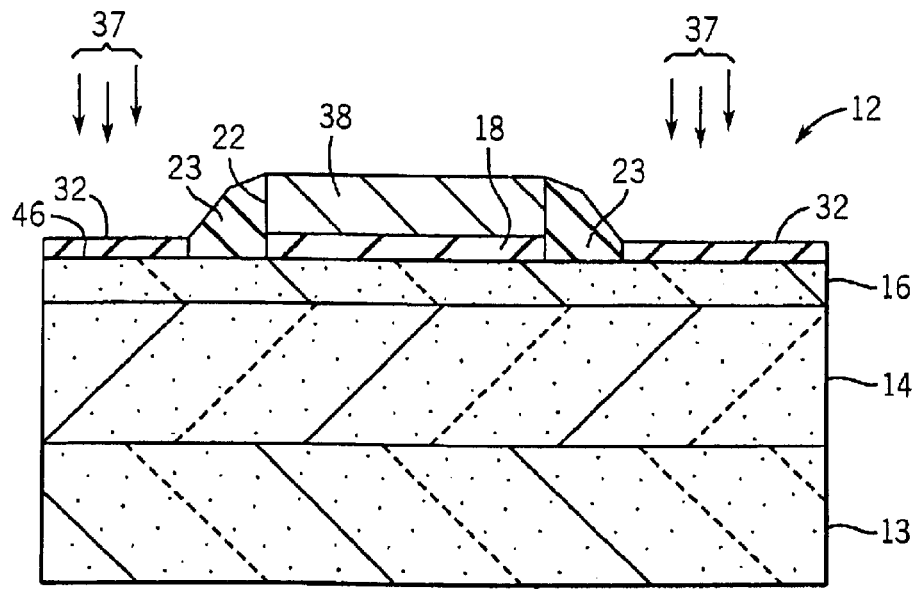
FIG. 7 is a cross-sectional view of the portion illustrated in FIG. 6, showing a plasma pre-cleaning step.
Figure 10:
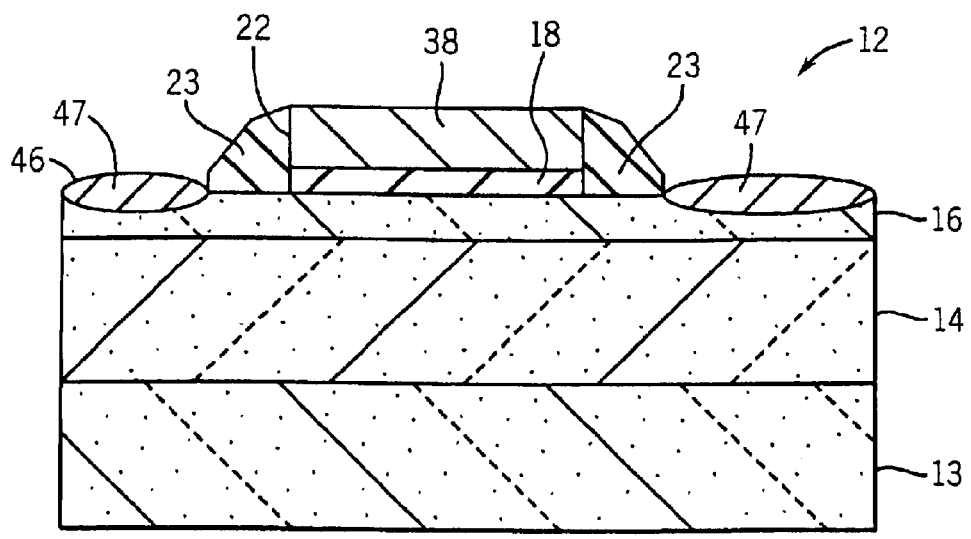
FIG. 10 is a cross-sectional view of the portion illustrated in FIG. 8, showing a silicidation step.

In FIG. 10, the conventional silicidation process is provided to leave silicide layers 47 in layer 16. Silicidation is enhanced due to the removal of oxide layer 32 (FIG. 7). Silicide layers 47 can be approximately 250–300 Å thick and may consume between approximately 100–300 Å (e.g. approximately 160 Å) of layer 16.

Where layers 47 utilize cobalt, a rapid thermal anneal (RTA) is performed at between approximately 450 and 500° C. for between approximately 5 and 30 seconds. A sulfuric acid and hydrogen peroxide (SPM) or a SPM and APM (ammonium hydroxide and hydrogen peroxide) process is then used. A second anneal is then performed at between approximately 700 and 800° C. for between 0 (e.g., a "spike" anneal) and 30 seconds.

Where layers 47 utilize nickel, a rapid thermal anneal (RTA) is performed at between approximately 320 and 400° C. for between approximately 5 and 30 seconds. A sulfuric acid and hydrogen peroxide (SPM) or a SPM and APM (ammonium hydroxide and hydrogen peroxide) process is then used. A second anneal is then performed at between approximately 480 and 500° C. for between 0 (e.g., a "spike" anneal) and 30 seconds.

Where layers 47 utilize titanium, a rapid thermal anneal (RTA) is performed at between approximately 400 and 500° C. for between approximately 5 and 30 seconds. A sulfuric acid and hydrogen peroxide (SPM) or a SPM and APM (ammonium hydroxide and hydrogen peroxide) process is then used. A second anneal is then performed at between approximately 800 and 900° C. for between 0 (e.g., a "spike" anneal) and 30 seconds.

With reference to FIGS. 11–16, portion 12 is slightly different than portion 12 described with reference to FIGS. 3–10. However, similar reference numerals refer to similar structures.

Figure 11:
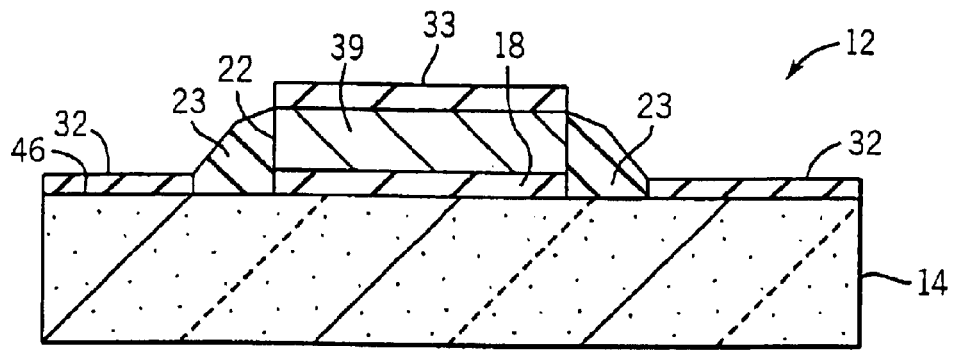
FIG. 11 is a cross-sectional view schematic drawing of a portion of an IC substrate illustrated in FIG. 1, the IC substrate including a strained silicon layer above a silicon germanium substrate and a silicon germanium gate conductor.

In FIG. 11, gate structure 22 preferably includes a semiconductor gate conductor 39. Gate conductor 39 is silicided in subsequent steps described below. In one embodiment, gate conductor 39 is a polysilicon/germanium gate conductor and is provided above a germanium containing substrate 14.

Substrate 14 can be a germanium substrate, a strained silicon substrate, or a silicon germanium substrate. Substrate 14 includes native oxide layer 32 above top surface 46 of substrate 14 and a native oxide layer 33 above gate conductor 39. Gate structure 22 can be formed in accordance with step 52 of process 100.

Figure 12:
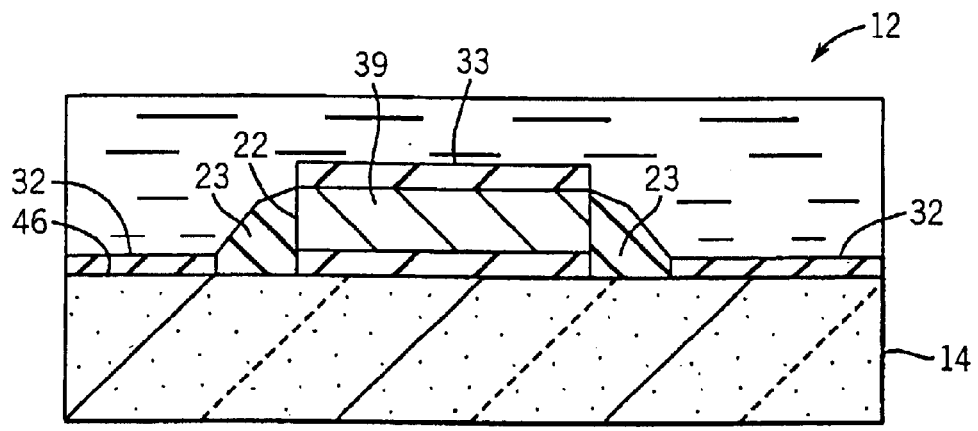
FIG. 12 is a cross-sectional view of the portion illustrated in FIG. 11, showing a dipping step.

In FIG. 12, portion 12 is subject to an HF dip in accordance with step 54 of process 100. The HF dip preferably reduces the thickness associated with native oxide layers 32 and 33.

Figure 13:
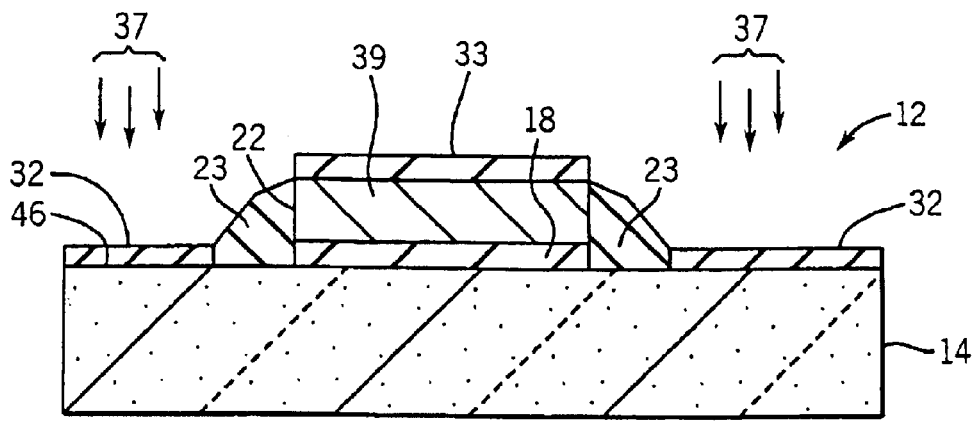
FIG. 13 is a cross-sectional view of the portion illustrated in FIG. 12, showing a plasma pre-cleaning step.
Figure 14:
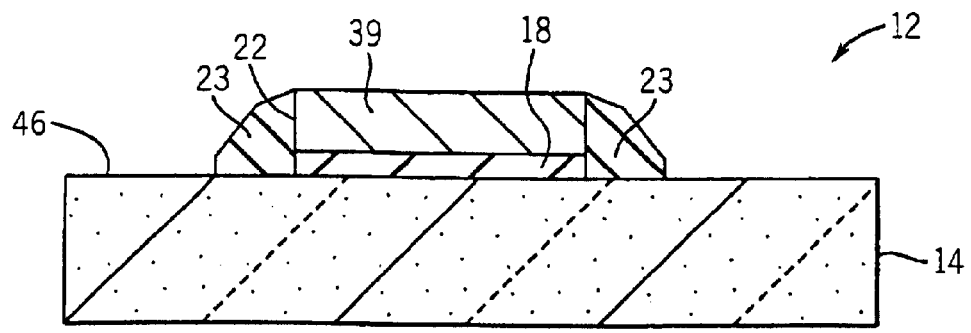
FIG. 14 is a cross-sectional view of the portion illustrated in FIG. 7, showing removal of the native oxide.

In FIG. 13, a plasma is utilized in step 54 to further reduce the thickness of layers 32 and 33. As shown in FIG. 14, layers 32 are removed from top surface 46 of substrate 14 and layer 32 is removed from above gate conductor 39. The plasma is preferably a hydrogen and argon plasma as discussed above with respect to step 54.

Figure 15:
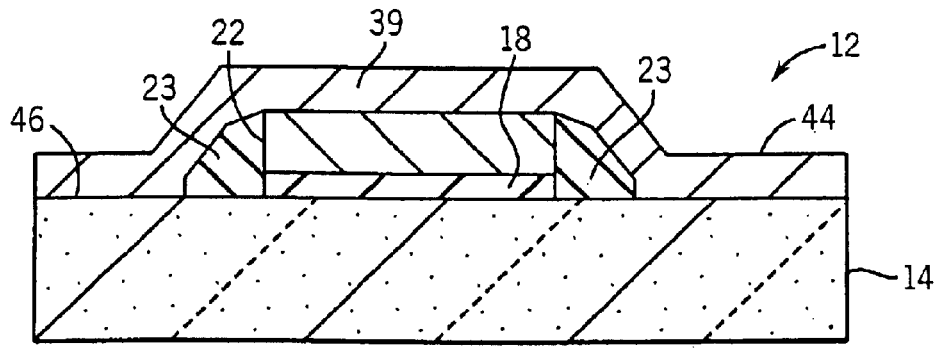
FIG. 15 is a cross-sectional schematic view of the portion illustrated in FIG. 14, showing a metal layer depletion step.
Figure 16:
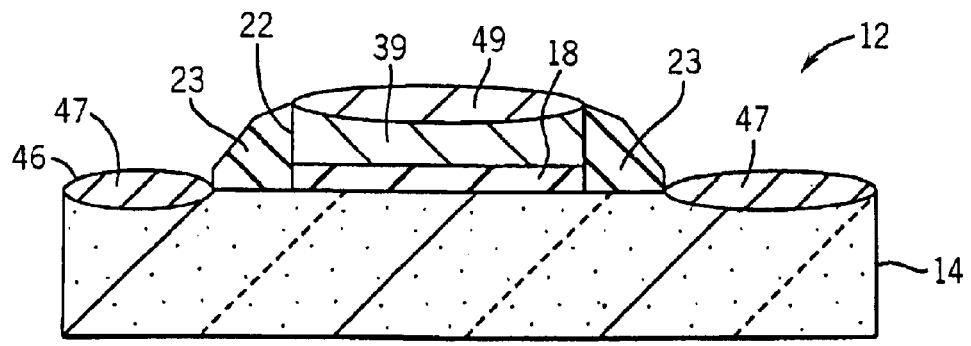
FIG. 16 is a cross-sectional view of the portion illustrated in FIG. 15, showing a silicidation step.

In FIG. 15, a metal layer 44 is deposited above gate structure 22 in a silicidation process associated with step 58. In FIG. 16, silicidation regions 47 and 49 are formed on portion 12. Silicidation region 49 is formed above gate conductor 39.

According to one exemplary embodiment, silicide regions 47 and 49 are provided by depositing layer 44 of metal (e.g., a refractory metal) and heating at an elevated temperature (e.g., between approximately 550 and 650° C.) to form a silicide material (e.g., a nickel silicide material). Other silicidation methods may be used in alternative embodiments.

It is understood that although the detailed drawings, specific examples, and particular values given provide exemplary embodiments of the present invention, the exemplary embodiments are for the purpose of illustration only. The method and apparatus in the aforementioned embodiments are not limited to the precise details and descriptions disclosed. For example, although particular IC structures are described, native oxide on other types of structures can also be removed. Various changes may be made to the details disclosed without departing from the scope of the invention which is defined by the following claims.

What is claimed is:

1. A method of manufacturing an integrated circuit comprising:
    providing a substrate, the substrate including a layer including germanium;
    providing a gate structure above the substrate;
    pre-cleaning the substrate using hydrofluoric acid after the step of providing a gate structure; and
    pre-cleaning the substrate with an argon and hydrogen plasma after the step of pre-cleaning the substrate using hydrofluoric acid; and
    siliciding the substrate.

2. The method of claim 1, wherein the step of pre-cleaning the substrate using hydrofluoric acid removes thermal oxide from the substrate and the step of pre-cleaning the substrate using an argon and hydrogen plasma removes thermal oxide remaining after the step of pre-cleaning the substrate using hydrofluoric acid.

3. The method of claim 1, wherein the step of pre-cleaning the substrate using an argon and hydrogen plasma utilizes a total gas pressure of approximately 100 Pa and a hydrogen flow rate of approximately 100 sccm.

4. The method of claim 1, wherein the step of pre-cleaning the substrate using hydrofluoric acid comprises exposing the substrate to a wet bath.

5. The method of claim 1, wherein the gate structure includes a polysilicon conductor.

6. The method of claim 5, wherein the polysilicon conductor is pre-cleaned and silicided.

7. A method of pre-cleaning a top surface of an IC substrate before silicidation in a chamber, the method comprising:
    exposing the IC substrate to hydrofluoric acid to remove native oxide from the IC substrate; and
    providing a plasma including hydrogen in the chamber to remove native oxide from the IC substrate remaining after the exposure of the IC substrate to hydrofluoric acid.

8. The method of claim 7, wherein the step of exposing the IC substrate to hydrofluoric acid comprises providing a wet bath to reduce a thickness of the native oxide.

9. The method of claim 8, wherein the wet bath utilizes hydrofluoric acid and water.

10. The method of claim 8, wherein the chamber is a vacuum chamber and a metal layer is deposited on the IC substrate in the chamber after the after the steps of exposing the IC substrate to hydrofluoric acid and providing a plasma including hydrogen in the chamber.

11. The method of claim 10, wherein the thickness of the native oxide on the IC substrate is eliminated using the wet bath.

12. The method of claim 7, further comprising providing a silicide layer.

13. The method of claim 7, further comprising evacuating the chamber.

14. The method of claim 7, wherein the plasma includes argon.

15. The method of claim 7, wherein the IC substrate includes a germanium containing gate conductor.

16. The method of claim 7, wherein the chamber is part of a deposition tool.

17. A method of manufacturing a transistor on an integrated circuit, the method comprising:
    providing a gate structure on a top surface of a strained silicon layer or a silicon germanium layer;
    removing a native oxide material from the strained silicon layer or silicon germanium layer using a hydrofluoric acid wet bath;
    providing a plasma including hydrogen and argon to remove the native oxide material; and
    siliciding the top surface.

18. The method of claim 17, further comprising utilizing hydrofluoric acid to remove a portion of the native oxide material before providing the plasma including hydrogen and argon.

19. The method of claim 18, wherein the siliciding is a nickel siliciding process.

20. The method of claim 19, wherein the top surface includes a silicon/germanium gate conductor.

* * * * *